(12) United States Patent
Shrivastava

(10) Patent No.: US 10,965,382 B1
(45) Date of Patent: Mar. 30, 2021

(54) OSCILLATOR FOR PULSE COMMUNICATION WITH REDUCED STARTUP LATENCY

(71) Applicant: Texas Instruments Incorporated, Dallas, TX (US)

(72) Inventor: Kumar Anurag Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/738,009

(22) Filed: Jan. 9, 2020

(51) Int. Cl.
| | |
|---|---|
| *H04B 14/02* | (2006.01) |
| *H03B 5/06* | (2006.01) |
| *H03B 5/12* | (2006.01) |
| *H04L 27/04* | (2006.01) |
| *H04L 25/03* | (2006.01) |
| *H04L 25/02* | (2006.01) |

(52) U.S. Cl.
CPC ............... *H04B 14/02* (2013.01); *H03B 5/06* (2013.01); *H03B 5/1203* (2013.01); *H03B 5/1253* (2013.01); *H04L 25/0266* (2013.01); *H04L 25/03834* (2013.01); *H04L 27/04* (2013.01); *H03B 2200/0064* (2013.01); *H03B 2200/0094* (2013.01); *H03B 2201/0266* (2013.01)

(58) Field of Classification Search
CPC ...... H03B 5/06; H03B 5/1253; H03B 5/1203; H03B 2201/0266; H03B 2200/0094; H03B 2200/0064; H04L 27/04; H04L 25/03834; H04L 25/0266; H04B 14/02
USPC ......... 332/100, 101, 102; 375/271, 272, 275
See application file for complete search history.

(56) References Cited

U.S. PATENT DOCUMENTS

| | | | | |
|---|---|---|---|---|
| 9,660,848 | B2 * | 5/2017 | Yun ......................... | H03C 1/60 |
| 9,978,511 | B2 * | 5/2018 | Spina ...................... | H01F 38/14 |
| 2016/0373056 | A1 * | 12/2016 | Kumar .................... | H03B 5/366 |
| 2018/0019661 | A1 * | 1/2018 | Gao ........................ | H02J 50/00 |
| 2018/0198411 | A1 * | 7/2018 | Stenman .................. | H03B 1/04 |

* cited by examiner

*Primary Examiner* — Arnold M Kinkead
(74) *Attorney, Agent, or Firm* — John R. Pessetto; Charles A. Brill; Frank D. Cimino

(57) ABSTRACT

An oscillator for use in pulse communication of pulse signals with a startup latency and a pulse oscillation signal (such as for use in a transmitter for OOK pulse communication with pulse modulation). The oscillator includes an LC resonator having a tank impedance, and including a high-side node (Vp), and a low-side node Vn, and having a tank voltage corresponding to [Vp-Vn]. A pulse startup circuit, includes a PMOS transistor with a source connected to a supply voltage VDD, and a drain connected through a resistance R to the Vp node (where R is significantly larger than the tank impedance), and connected to an attenuation capacitance, in parallel with the resistance R. The PMOS control terminal is coupled to receive a kick start pulse to initiate a pulse signal. the oscillator can include high-side and low-side pulse startup circuits.

20 Claims, 5 Drawing Sheets

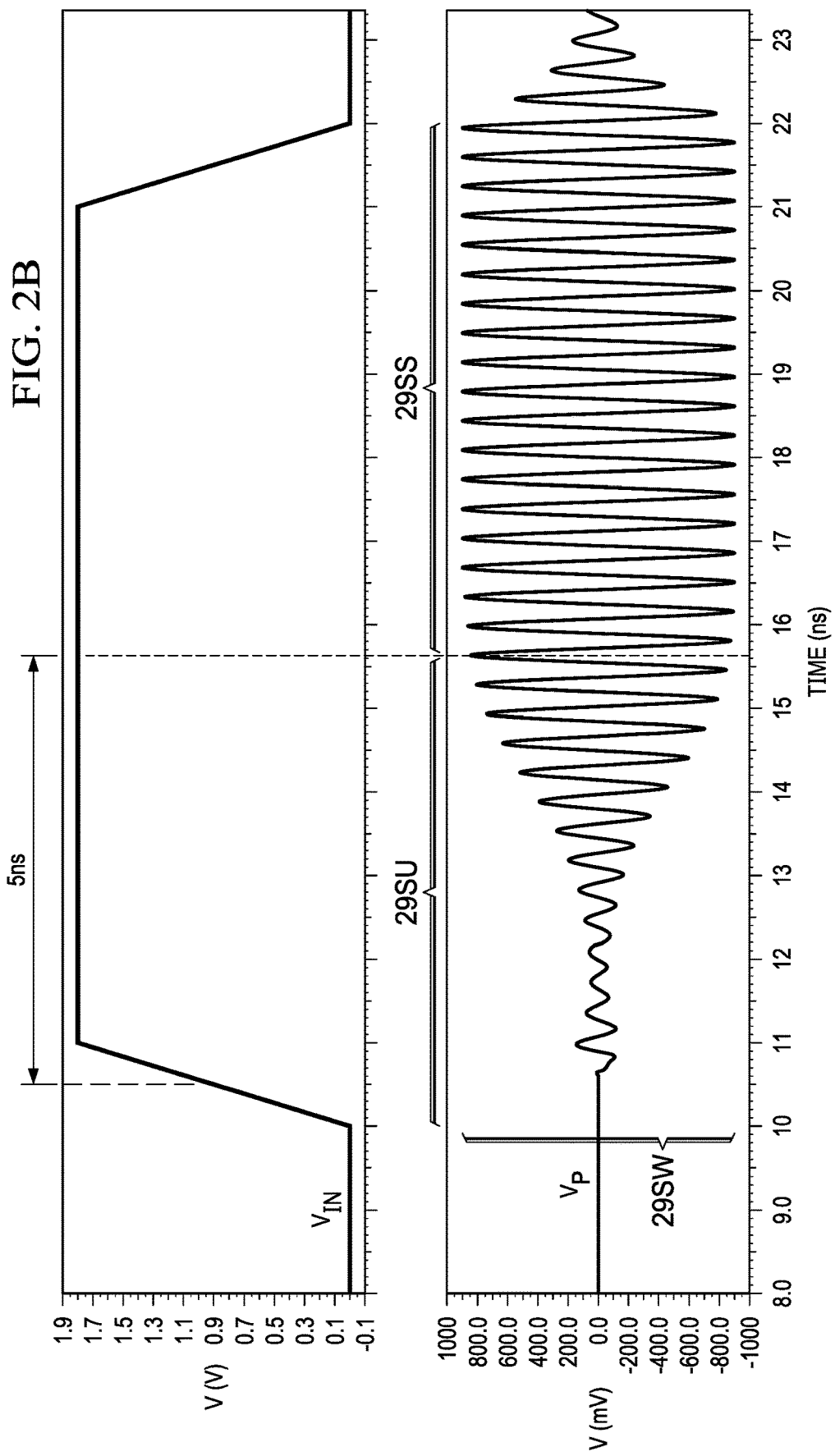

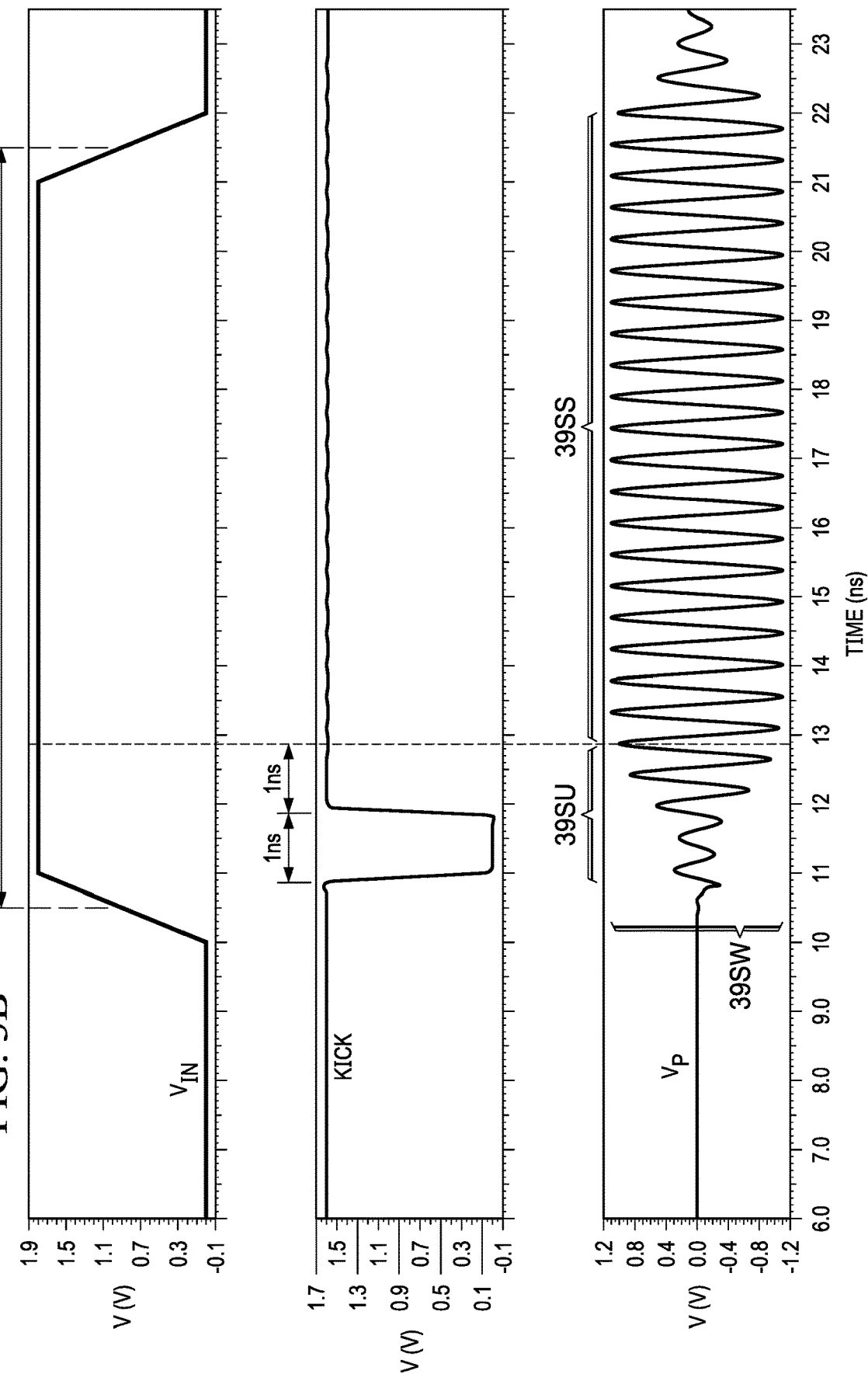

OSCILLATOR FOR PULSE COMMUNICATION WITH REDUCED STARTUP LATENCY

BACKGROUND

A digital isolator can use an oscillator for digital pulse communication with pulse (oscillation) signals across an isolation barrier. FIG. 1 illustrates a digital isolator 10 with a TX oscillator 11 and RX receiver (tank) 12, coupled capacitively or inductively over an isolation barrier 15. Data signals are encoded 17, and transmitted 11 as pulse signals that are sensed by the receiver, and decoded 18 back to digital.

Communication is based on pulse modulation, for example, pulse code, pulse amplitude, pulse width, and pulse position. For example, pulse communication can be based on on-off keying (OOK), with edge encoding (such as one pulse for a rising edge, and two pulses for a falling edge).

While this Background information references digital isolators, this Disclosure is more generally directed to oscillator designs for pulse communication.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for an oscillator for pulse communication with active kick start for reduced startup latency.

According to aspects of the Disclosure, an oscillator for use in pulse communication of pulse signals with a startup latency and a pulse oscillation signal, includes an LC resonator including an inductance L, and a capacitance C, and having a tank impedance. The LC resonator including a high-side node (Vp), and a low-side node Vn, and having a tank voltage corresponding to [Vp-Vn]. A pulse startup circuit includes a PMOS transistor with a source connected to a supply voltage VDD, and a drain connected through a resistance R to the Vp node, where R is significantly larger than the tank impedance, and an attenuation capacitance connected to the drain, in parallel with the resistance R. The PMOS transistor including a control terminal coupled to receive a kick start pulse to initiate a pulse signal.

According to other aspects of the Disclosure, a circuit for transmitting pulse signals with a startup latency and a pulse oscillation signal, includes transmitter circuitry including an oscillator configured to generate pulse signals. The oscillator includes an LC resonator including an inductance L, and a capacitance C, and having a tank impedance, the LC resonator including a high-side node (Vp), and a low-side node Vn, and having a tank voltage corresponding to [Vp-Vn]. Pulse startup circuitry, includes a PMOS transistor with a source connected to a supply voltage VDD, and a drain connected through a resistance R to the Vp node, where R is significantly larger than the tank impedance, and an attenuation capacitance connected to the drain, in parallel with the resistance R. The PMOS transistor including a control terminal coupled to receive a kick start pulse to initiate a pulse signal.

According to other aspects of the Disclosure, a method of pulse communication of pulse signals with a startup latency and a pulse oscillation signal, for use in a system with a transmitter oscillator including an LC resonator including an inductance L, and a capacitance C, and having a tank impedance, the LC resonator including a high-side node (Vp), and a low-side node Vn, and having a tank voltage corresponding to [Vp-Vn]. The method includes: initiating a pulse signal from the oscillator with a kick start pulse; and generating the kick start pulse with a pulse startup circuit, including a PMOS transistor with a source connected to a supply voltage VDD, and a drain connected through a resistance R to the Vp node, where R is significantly larger than the tank impedance, and an attenuation capacitance connected to the drain, in parallel with the resistance R, the PMOS transistor including a control terminal coupled to receive the kick start pulse to initiate a pulse signal.

Other aspects and features of the invention claimed in this Patent Document will be apparent to those skilled in the art from the following Disclosure.

BRIEF DESCRIPTION OF THE DRAWINGS

FIGS. 2A-2B illustrate an oscillator for pulse communication, such as for use in a digital isolator: FIG. 2A illustrates an example oscillator 21, for pulse communication, including generation of a pulse (oscillation) signal; and FIG. 2B illustrates an example pulse signal with a pulse width based on a startup latency, followed by a pulse oscillation (steady state oscillation with a defined swing).

FIG. 3B illustrates example pulse signal waveforms, including an example pulse signal with a defined startup latency after pulse initiation, followed by pulse oscillation (steady state oscillation with a defined swing).

DETAILED DESCRIPTION

This Description and the Drawings constitute a Disclosure, including design examples and implementations, and including illustrating various technical features and advantages for: an oscillator for pulse communication with active kick start for reduced startup latency.

An example application is digital isolation based on a transmitter oscillator for pulse (oscillation) communication, capacitively (or inductively) coupled to a receiver across an isolation barrier. An example alternate application is a transmitter oscillator for pulse communication, coupled to an antenna for wireless communication to a remote receiver. An example pulse modulation is OOK (on-off keying), with edge encoding.

This Disclosure uses the following nomenclature: A pulse signal or pulse oscillation signal includes a startup swing period (startup latency), followed by a specified steady state swing period (pulse oscillation period), with pulse width determined by startup latency and the pulse oscillation period (at steady state swing). The startup latency, can also be referred to as the wakeup or settling time. For pulse communication, including the example OOK modulation, startup latency is an important aspect of pulse width, and therefore an important determinant of system power, delay and speed.

In brief overview, an oscillator for use in pulse communication of pulse signals with a startup latency and a pulse oscillation signal, includes an LC resonator having a tank impedance, and including a high-side node (Vp), and a low-side node Vn, and having a tank voltage corresponding to [Vp-Vn]. A pulse startup circuit, includes a PMOS transistor with a source connected to a supply voltage VDD, and a drain connected through a resistance R to the Vp node (where R is significantly larger than the tank impedance), and connected to an attenuation capacitance, in parallel with the resistance R. The PMOS control terminal is coupled to receive a kick start pulse (for example, 1 ns) to initiate a pulse signal. the oscillator can include high-side and low-side pulse startup circuits. An example application is a transmitter oscillator for OOK pulse communication with pulse modulation.

Figure 2A:
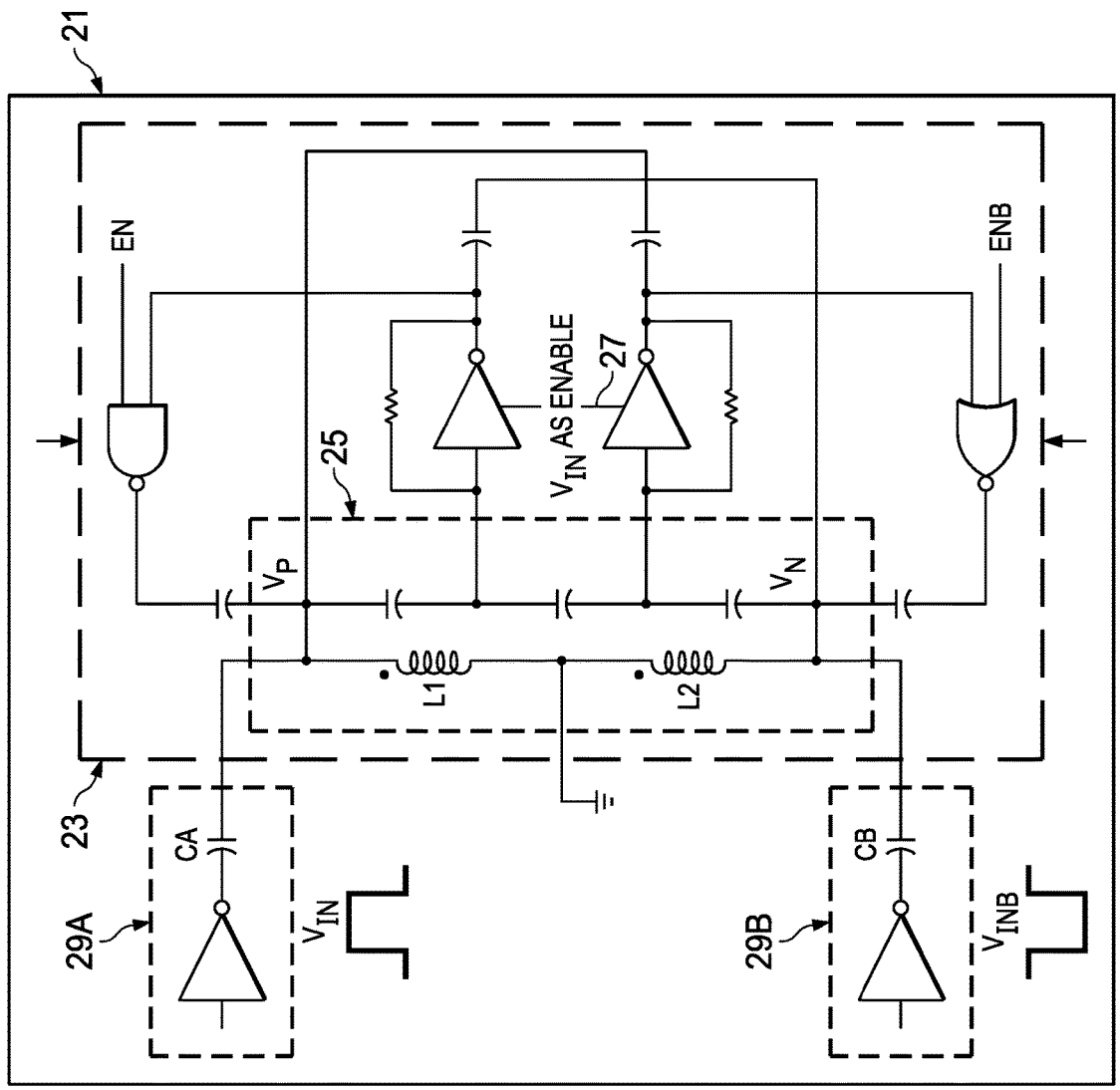

FIG. 2A illustrates an oscillator 21, for pulse communication, including generation of a pulse (oscillation) signal. FIG. 2B illustrates an example pulse signal with a pulse width based on a startup latency, followed by a pulse oscillation (steady state oscillation with a defined swing).

Oscillator 21 is configured for a digital isolation application, the oscillator configured as a transmitter for pulse communication (OOK) across an isolation barrier.

Oscillator 21 includes an oscillator core 23 with an LC resonator (tank) 25, and a two stage feedback generator 27. LC resonator 25 includes coupled inductors L1 and L2 with a center tap to ground. The tank inductors L1/L2 are connected between a high-side node Vp and a low-side node Vn. The voltage difference between the Vp and Vn nodes is the tank voltage [Vp-Vn], which defines the (voltage) swing of the oscillator (each of the nodes Vp/Vn sees one-half of the tank voltage swing). Parasitic capacitance (which can be tuned by the tank inductors L1/L2) is not shown.

Oscillator 21 includes high-side and low-side startup circuits 29A and 29B coupled to respective nodes Vp and Vn. Startup circuits 29A and 29B include respective startup capacitors CA and CB to provide initial energy in the LC resonator tank 25 at the transition of VIN. VIN is an input to the startup circuits 29A/29B (and provides an enable signal to the feedback generator). For higher levels of VIN, the startup capacitors CA and CB become part of the LC resonator tank, which can limit swing, and reduce oscillation frequency. Energy pumped is proportional to the capacitor ratios for the startup capacitors and tank capacitors, and VDD (for example, 1.8V), so CA,CB should be lower capacitance for higher swing, and higher for faster startup.

Referring to FIG. 2B, an example pulse signal is initiated by the VIN current pulse input to the resonator tank 25 through the startup capacitors CA/CB. An example startup latency after initiation is 5 ns before pulse oscillation (steady state swing) is achieved.

Pulse width and pulse oscillation period (effective energy transfer) are determined by receiver pulse signal sensing requirements. The example pulse signal is 7 ns of pulse oscillation (steady state swing) 29SS, after the startup latency 29SU of 5 ns, for a total pulse width of 12 ns, with a pulse swing 29SW (tank voltage) of 1.8V.

Figure 3A:
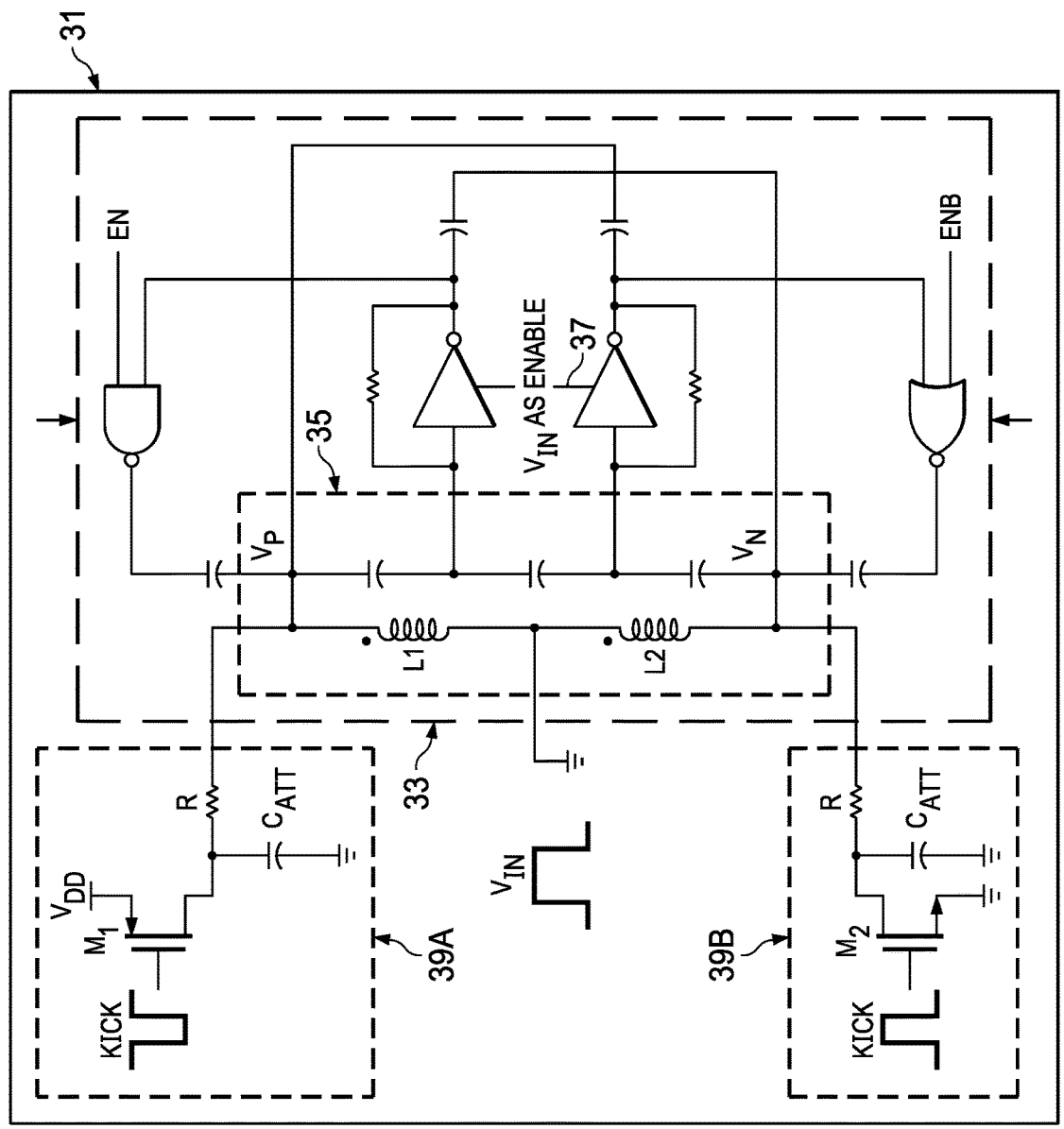
FIG. 3A illustrates an example oscillator 31 with an active kick start circuit 39A/39B for pulse communication with reduced startup latency, according to the Disclosure.

FIGS. 3A and 3B illustrate an example oscillator 31 with an active kick start circuit for pulse communication with reduced startup latency, according to the Disclosure. The example oscillator 31 can be implemented in an example digital isolator, using capacitive isolation, with advantages in low power and isolation voltage specification.

FIG. 3A illustrates the example oscillator 31 with example high-side and low-side active kick start circuits 39A and 39B. FIG. 3B illustrates example pulse signal waveforms, including an example pulse signal with a defined startup latency after pulse initiation, followed by pulse oscillation (steady state swing).

As illustrated in FIG. 3B, the active kick start circuit according to the Disclosure can provide a pulse oscillation signal in which startup latency 39SU is reduced to 2 ns (from 5 ns), enabling a pulse oscillation period (steady state swing) 39SS of 9 ns (increased from 7 ns). The resulting pulse width is 11 ns pulse width (decreased from 12 ns).

Figure 1:
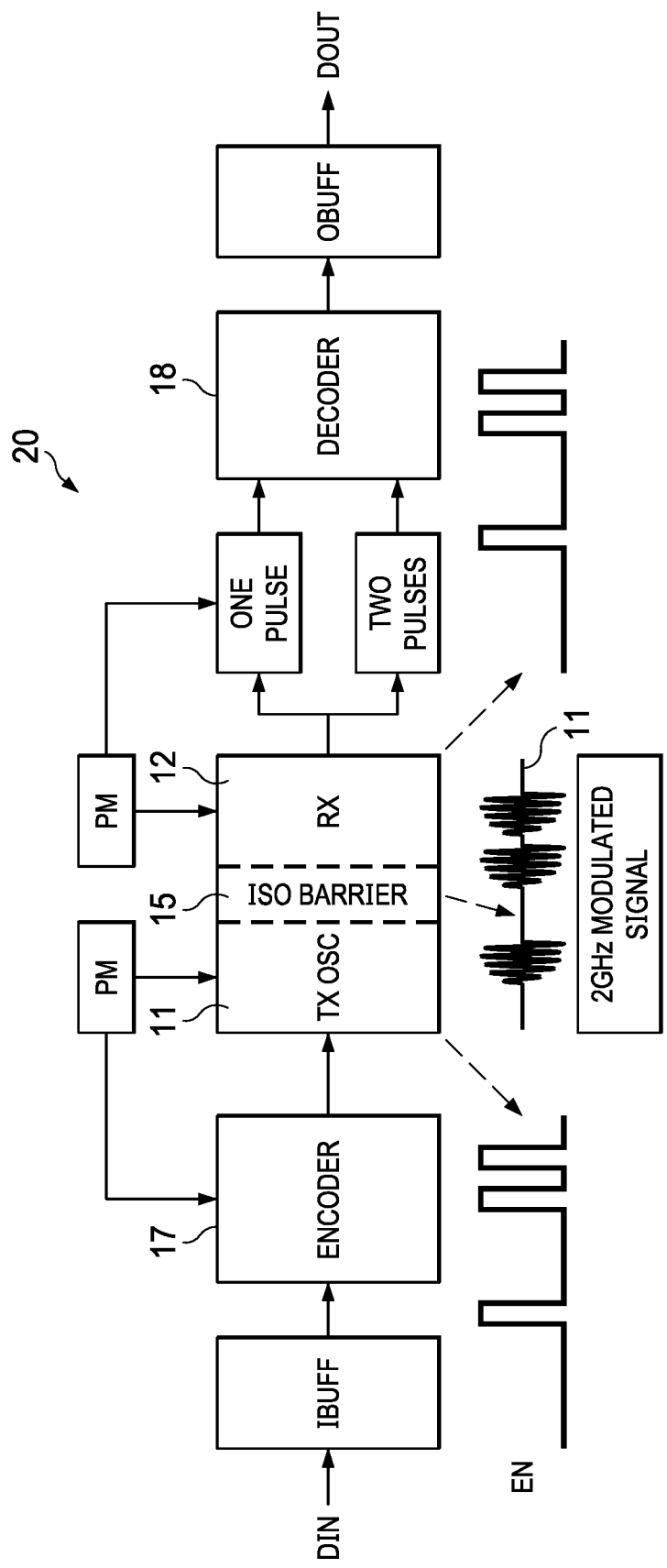
FIG. 1 illustrates a digital isolator 10 with a TX oscillator 11 and RX receiver (tank) 12, coupled capacitively or inductively over an isolation barrier 15, configured for example OOK pulse modulation.

The example oscillator 31 includes an example oscillator core 33, and the example active kick start circuits 39A and 39B. Example oscillator core 33 uses the oscillator core configuration in FIG. 2A. The active kick start circuits 39A and 39B function to reduce startup latency according to the Disclosure, replacing the (passive) capacitive startup circuits 29A/29B in FIG. 1 (eliminating the startup capacitors CA/CB).

The oscillator core can include any suitable structure for an LC resonator. In an example implementation, the oscillator core 33 includes, in addition to the LC resonator 35, a two stage feedback generator 37.

LC resonator 35 includes coupled inductors L1 and L2 with a center tap to ground (although the inductor center tap could be tied to a different voltage). If the inductor center tap is ground, the low-side active kick start circuit 39B is not required (if the inductor center tap is a voltage different than ground, the low-side active kick start circuit is recommended). Parasitic capacitance (which can be tuned by the tank inductors L1/L2) is not shown The resonator tank coupled inductors L1/L2 are connected between a high-side node Vp and a low-side node Vn. The voltage difference between the Vp and Vn nodes is the tank voltage [Vp-Vn], which defines the (voltage) swing of the oscillator (each of the nodes Vp/Vn sees one-half of the tank voltage swing).

The example active kick start circuits 39A and 39B are coupled to respective LC resonator tank nodes Vp and Vn. The input VIN is used to enable the feedback generator 37, but is not input to the active kick start circuits 39A/39B.

Active kick start circuit 39A includes a PMOS M1 with a source coupled to VDD, and a drain coupled through resistor R to the resonator tank Vp node. A CATT capacitor is connected to the PMOS drain in parallel with R, forming a low pass filter for attenuating oscillation frequencies. Optional low-side active kick start circuit 39B includes an NMOS M2 with a source coupled to ground, and a drain coupled through resistor R to the resonator tank Vn node. A CATT capacitor is connected to the NMOS drain in parallel with R, forming a low pass filter.

For both example kick start circuits, R is chosen to be significantly larger than the tank impedance, for example 5-10×, so that the kick startup circuit(s) does(do) not impact steady state swing. For an example tank parallel resonance impedance of 1K, an example kick start circuit can be configured with R=10K, and a CATT of 100 fF.

Active kick start circuit 39A receives a kick startup voltage pulse at the M1 control terminal, generating a kick start current pulse through the resonator inductors L1/L2, and initiating a pulse signal. The initial startup current for both active kick start circuits 39A/39B is VDD/R, and energy is input to the resonator tank 35 for only the duration of the kick start pulse (for example, 1 ns).

Pulse width is selected based on receiver pulse sensing requirements for pulse oscillation (effective energy transfer).

Referring to FIG. 3B, the example pulse signal is 9 ns of pulse oscillation (steady state swing) 39SS, for a total pulse width of 11 ns, with a pulse swing (tank voltage) 39SW of 1.8V.

The CATT capacitors attenuate oscillation frequency, which doesn't impact startup DC current, and provide protection of the M1/M2 GOI by holding the M1/M2 drains low. When the kick start pulse is off, M1 and M2 float, but are off and present a high impedance.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. An oscillator for use in pulse communication of pulse signals with a startup latency and a pulse oscillation signal, comprising:
    an LC resonator including an inductance L, and a capacitance C, and having a tank impedance;
    the LC resonator including a high-side node (Vp), and a low-side node Vn, and having a tank voltage corresponding to [Vp-Vn];
    a pulse startup circuit, including:
        a PMOS transistor with a source connected to a supply voltage VDD, and a drain connected through a resistance R to the Vp node, where R is significantly larger than the tank impedance, and
        an attenuation capacitance connected to the drain, in parallel with the resistance R,
        the PMOS transistor including a control terminal coupled to receive a kick start pulse to initiate a pulse signal.

2. The oscillator of claim 1, wherein the pulse startup circuit is a high-side pulse startup circuit with a first resistance R and a first attenuation capacitance, and further comprising:
    a low-side pulse startup circuit, including:
        an NMOS transistor with a source connected to a circuit common, and a drain connected through a second resistance R to the Vn node, where the second resistance R is significantly larger than the tank impedance,
        a second attenuation capacitance connected to the drain, in parallel with the second resistance R,
        the NMOS transistor including a control terminal coupled to receive a kick start pulse to initiate a pulse signal.

3. The oscillator of claim 1, wherein the kick start pulse is applied to the PMOS control input so that the initial startup current through L is VDD/R.

4. The oscillator of claim 1, wherein the attenuation capacitance attenuates oscillation frequencies without affecting initiation of the pulse signal by the kick start pulse.

5. The oscillator of claim 1, wherein the duration of the kick start pulse is in the range of 1 ns.

6. The oscillator of claim 1, wherein pulse communication is based on on-off keying (OOK), with edge encoding.

7. The oscillator of claim 1, wherein the oscillator is used in a digital isolator as the transmit oscillator.

8. A circuit for transmitting pulse signals with a startup latency and a pulse oscillation signal, the circuit comprising:
    transmitter circuitry including an oscillator configured to generate pulse signals, the oscillator including:
        an LC resonator including an inductance L, and a capacitance C, and having a tank impedance,
        the LC resonator including a high-side node (Vp), and a low-side node Vn, and having a tank voltage corresponding to [Vp-Vn];
    pulse startup circuitry, including:
        a PMOS transistor with a source connected to a supply voltage VDD, and a drain connected through a resistance R to the Vp node, where R is significantly larger than the tank impedance, and
        an attenuation capacitance connected to the drain, in parallel with the resistance R,
        the PMOS transistor including a control terminal coupled to receive a kick start pulse to initiate a pulse signal.

9. The circuit of claim 8, wherein the pulse startup circuitry is high-side pulse startup circuitry with a first resistance R and a first attenuation capacitance, and further comprising:
    low-side pulse startup circuitry, including:
        an NMOS transistor with a source connected to a circuit common, and a drain connected through a second resistance R to the Vn node, where the second resistance R is significantly larger than the tank impedance,
        a second attenuation capacitance connected to the drain, in parallel with the second resistance R,
        the NMOS transistor including a control terminal coupled to receive a kick start pulse to initiate a pulse signal.

10. The circuit of claim 8, wherein the kick start pulse is applied to the PMOS control input so that the initial startup current through L is VDD/R.

11. The circuit of claim 8, wherein the attenuation capacitance attenuates oscillation frequencies without affecting initiation of the pulse signal by the kick start pulse.

12. The circuit of claim 8, wherein the duration of the kick start pulse is in the range of 1 ns.

13. The circuit of claim 8, wherein pulse communication is based on on-off keying (OOK), with edge encoding.

14. The circuit of claim 8, wherein the transmitter circuitry is used in a digital isolator.

15. A method of pulse communication of pulse signals with a startup latency and a pulse oscillation signal, the method for use in a system with a transmitter oscillator including an LC resonator including an inductance L, and a capacitance C, and having a tank impedance, the LC resonator including a high-side node (Vp), and a low-side node Vn, and having a tank voltage corresponding to [Vp-Vn], the method comprising:
    initiating a pulse signal from the oscillator with a kick start pulse;
    generating the kick start pulse with a pulse startup circuit, including:
        a PMOS transistor with a source connected to a supply voltage VDD, and a drain connected through a resistance R to the Vp node, where R is significantly larger than the tank impedance, and
        an attenuation capacitance connected to the drain, in parallel with the resistance R,
        the PMOS transistor including a control terminal coupled to receive the kick start pulse to initiate a pulse signal.

16. The method of claim 15, wherein the pulse startup circuit is a high-side pulse startup circuit with a first resistance R and a first attenuation capacitance, and further comprising:
    a low-side pulse startup circuit, including:

an NMOS transistor with a source connected to a circuit common, and a drain connected through a second resistance R to the Vn node, where the second resistance R is significantly larger than the tank impedance, a second attenuation capacitance connected to the drain, in parallel with the second resistance R, the NMOS transistor including a control terminal coupled to receive a kick start pulse to initiate a pulse signal.

17. The method of claim 15, wherein the attenuation capacitance attenuates oscillation frequencies without affecting initiation of the pulse signal by the kick start pulse.

18. The method of claim 15, wherein the duration of the kick start pulse is in the range of 1 ns.

19. The method of claim 15, wherein pulse communication is based on on-off keying (OOK), with edge encoding.

20. The method of claim 15, wherein the transmitter oscillator is used in a digital isolator.

* * * * *